(12) United States Patent
Hellberg et al.

(10) Patent No.: US 12,494,747 B2
(45) Date of Patent: Dec. 9, 2025

(54) AMPLIFIER PROTECTION CIRCUIT AND METHOD

(71) Applicant: Telefonaktiebolaget LM Ericsson (publ), Stockholm (SE)

(72) Inventors: Richard Hellberg, Huddinge (SE); Rui Hou, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 630 days.

(21) Appl. No.: 17/801,298

(22) PCT Filed: Feb. 25, 2020

(86) PCT No.: PCT/SE2020/050208
§ 371 (c)(1),
(2) Date: Aug. 22, 2022

(87) PCT Pub. No.: WO2021/173047
PCT Pub. Date: Sep. 2, 2021

(65) Prior Publication Data
US 2023/0088158 A1    Mar. 23, 2023

(51) Int. Cl.
*H03F 1/52*  (2006.01)
*H03F 3/60*  (2006.01)

(52) U.S. Cl.
CPC .............. *H03F 1/52* (2013.01); *H03F 3/602* (2013.01)

(58) Field of Classification Search
CPC ... H03F 1/52; H03F 3/602; H03F 1/14; H03F 2200/451; H03F 3/195; H03F 3/217;
(Continued)

(56) References Cited

U.S. PATENT DOCUMENTS

| | | | | | |
|---|---|---|---|---|---|
| 6,297,696 | B1 * | 10/2001 | Abdollahian | ........... | H03F 3/602 375/238 |
| 7,941,105 | B1 * | 5/2011 | McCall | ................ | H04B 1/0458 455/114.2 |
| 9,431,969 | B2 * | 8/2016 | Jeon | ......................... | H03F 3/195 |
| 10,418,937 | B2 * | 9/2019 | Jeon | ....................... | H03K 3/011 |

(Continued)

FOREIGN PATENT DOCUMENTS

DE    102015208490 A1    11/2016
WO    2013099077 A1    7/2013
(Continued)

OTHER PUBLICATIONS

Chang, Jen-Feng, et al., "Design and Analysis of 24-GHz Active Isolator and Quasi-Circulator", IEEE Transactions on Microwave Theory and Techniques, vol. 63, No. 8, Aug. 8, 2022, 2618-2649.
(Continued)

*Primary Examiner* — Khanh V Nguyen
(74) *Attorney, Agent, or Firm* — Murphy, Bilak & Homiller, PLLC

(57) ABSTRACT

Methods and apparatus are provided. In an example aspect, an amplifier protection circuit is provided. The amplifier protection circuit comprises an input for receiving a signal from a first amplifier, and an isolation circuit between the input and an output of the amplifier protection circuit. The isolation circuit is configured to sense a backward signal propagating from the output of the amplifier protection circuit towards the input to provide a sensed signal, and to provide at least one cancellation signal based on the sensed signal to at least partially cancel the backward signal.

17 Claims, 5 Drawing Sheets

(58) Field of Classification Search
CPC ............... H03F 1/523; H03F 2200/78; H04B 2001/0408; H04B 1/04; H03G 3/3042
USPC ............................................ 330/207 P, 298
See application file for complete search history.

(56) References Cited

U.S. PATENT DOCUMENTS

| | | |
|---|---|---|
| 2005/0159119 A1 | 7/2005 | Kataoka et al. |
| 2007/0069820 A1* | 3/2007 | Hayata .................. H03F 3/68 |
| | | 330/298 |
| 2019/0267956 A1 | 8/2019 | Granger-Jones et al. |

FOREIGN PATENT DOCUMENTS

| | | |
|---|---|---|
| WO | 2016056952 A1 | 4/2016 |
| WO | 2017082776 A1 | 5/2017 |

OTHER PUBLICATIONS

Leisten, O. P., et al., "Distributed Amplifiers as Duplexer/Low Crosstalk Bidirectional Elements in S-Band", Electronics Letters, vol. 24, No. 5, Mar. 3, 1988, 264-265.

Pyndiah, R., et al., "Novel Multioctave MMIC Active Isolator (1-20 GHz)", Electronics Letters, vol. 25, No. 21, Oct. 12, 1989, 1420-1422.

Shepphard, Daniel J., et al., "An Efficient Broadband Reconfigurable Power Amplifier Using Active Load Modulation", IEEE Microwave and Wireless Components Letters, vol. 26, No. 6, Jun. 2016, 443-445.

* cited by examiner

AMPLIFIER PROTECTION CIRCUIT AND METHOD

TECHNICAL FIELD

Examples of the present disclosure relate to an amplifier protection circuit, and a method of protecting an amplifier circuit.

BACKGROUND

Power amplifiers (PA) that have high efficiency at low (backed off) amplitudes generally have either large impedance transformation from the output to some transistors, or lowered supply voltage at some transistors. This can be achieved either statically, for example in a Doherty amplifier, or dynamically, for example with a time-varying supply voltage.

Due to the large transformation ratio or low voltage these transistors are vulnerable to waves going backwards into the PA. These reverse waves (also referred to herein as backward signals) are often due to reflections from antennas and filters and leakage between antennas, but can also be signals arriving at the antenna from external sources (e.g. interference). The vulnerability due to transformation ratio arises because the reverse waves are increased in voltage by the transforming action itself. It is generally worse for amplifiers with efficiency maxima at low amplitudes since they tend to have higher transformation ratio or lower supply voltage. The large voltage at the transistors can lead to voltage breakdown (catastrophic failure) or can saturate the transistors so that they cannot provide the correct output.

Affected amplifiers include both older types such as the Doherty, Chireix, load modulated, and dynamic supply voltage amplifiers, as well as recently proposed load modulated balanced amplifiers (LMBA) [1] and distributed efficient power amplifiers (DEPA). The problem is exacerbated in these new amplifier types (LMBA and DEPA) by the much larger bandwidths that they are capable of. This means that traditional ferrite isolators often do not work satisfactorily.

A standard solution to some of the problems identified above is to attenuate the reverse waves with ferrite isolators. Since these are passive, they don't consume any dc power, and they can also have low insertion loss. However, ferrite isolators are often bulky since they use ferrite slabs and magnets. They are typically also narrowband and have an insertion loss that is worse for smaller or more wideband versions. Due to the materials used they are also hard to integrate in an Integrated circuit (IC) or monolithic microwave integrated circuit (MMIC) process.

As a solution to the size and bandwidth problems of passive ferrite isolators, many types of active isolators have been proposed. Some use the nonreciprocity of a transistor, for example with a feedback arrangement as disclosed in [2], which may achieve high isolation over a wide bandwidth. Another approach has been to use the inherent directionality of a distributed amplifier as disclosed in [3]. This achieves some of the function of a circulator, directivity for an output signal. Yet another method is to use the nonreciprocity of a transistor amplifier in combination with directional couplers. One such method is described in [4]. Yet more methods exist that exhibit either isolator or circulator functionality but are more limited in choice of implementation technology. These include for example active metamaterials and time-variant circuits with switches/commutators or variable reactance.

Active isolators generally suffer from one or more problems. Some suffer from high insertion loss, such as the transistor feedback circuit in [2]. Some suffer from low bandwidth, such as the directional coupler method of [4]. Some have directivity but not true isolation, such as the distributed amplifiers of [3].

SUMMARY

One aspect of the present disclosure provides an amplifier protection circuit. The amplifier protection circuit comprises an input for receiving a signal from a first amplifier, and an isolation circuit between the input and an output of the amplifier protection circuit. The isolation circuit is configured to sense a backward signal propagating from the output of the amplifier protection circuit towards the input to provide a sensed signal, and to provide at least one cancellation signal based on the sensed signal to at least partially cancel the backward signal.

Another aspect of the present disclosure provides an amplifier circuit comprising a first amplifier and the above amplifier protection circuit. The amplifier protection circuit is connected between an output of the first amplifier and an output of the amplifier circuit.

A further aspect of the present disclosure provides a transmitter comprising the above amplifier circuit.

An additional aspect of the present disclosure provides a method of protecting an amplifier circuit. The amplifier circuit comprises a first amplifier. The method comprises sensing a backward signal propagating from an output of the amplifier circuit towards the first amplifier to provide a sensed signal, and providing at least one cancellation signal based on the sensed signal to at least partially cancel the backward signal.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The following sets forth specific details, such as particular embodiments or examples for purposes of explanation and not limitation. It will be appreciated by one skilled in the art that other examples may be employed apart from these specific details. In some instances, detailed descriptions of well-known methods, nodes, interfaces, circuits, components and devices are omitted so as not obscure the description with unnecessary detail.

This disclosure provides examples of amplifier protection circuits, such as isolation circuits, that sense a backward signal on an output transmission line following an amplifier, and provide one or more cancellation signals to at least partially cancel the backward wave. This may be achieved for example by providing a sensed backwards wave signal to inputs of a set of amplifiers connected to the same transmission line. The amplifiers then inject signals (e.g. currents) into the drain side line or hybrid that are in sync but in antiphase with the backwards traveling wave itself. Thus the backward signal may be at least partially cancelled.

The set of amplifiers can be for example a distributed amplifier section (DA) or an unterminated balanced amplifier (BA). These can also in some examples provide forward amplification and thus, with proper dimensioning, we can in many cases use the same section that is already used for amplification in the forward direction of a DEPA or LMBA also for the backward isolation.

Examples of this disclosure can provide amplifier protection circuits that may protect the most sensitive parts of many types of high-efficiency amplifiers, including wideband types such as LMBA and DEPA. They may have one or more of the following advantages. They may have lower insertion loss and be smaller than wideband ferrite isolators, and may have lower insertion loss than prior wideband active isolators. They may have wider bandwidth than prior low-loss active isolators. They may use the same implementation technology and building practice as the wideband amplifiers themselves. They may reuse parts of a DEPA or LMBA.

Figure 1:
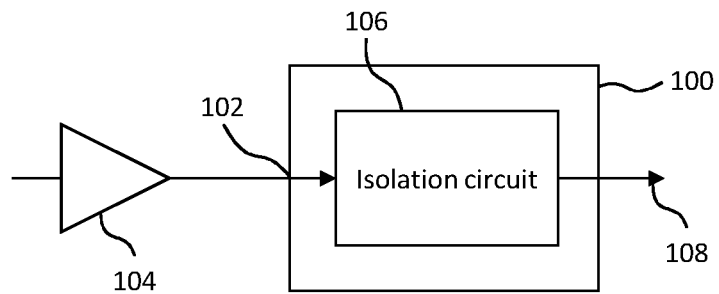
FIG. 1 is a schematic of an example of an amplifier protection circuit.

FIG. 1 is a schematic of an example of an amplifier protection circuit 100. The amplifier protection circuit 100 includes an input 102 for receiving a signal output from a first amplifier 104, though the first amplifier 104 is not part of the amplifier protection circuit in this example. The amplifier protection circuit 100 also includes an isolation circuit 106 between the input 102 and an output 108 of the amplifier protection circuit 108. The isolation circuit is configured to sense a backward signal propagating from the output of the amplifier protection circuit towards the input to provide a sensed signal, and to provide at least one cancellation signal based on the sensed signal to at least partially cancel the backward signal. Thus for example the backward signal may be cancelled by destructive interference with the at least one cancellation signal so that a reduced backward signal (or no backward signal) reaches the output of the first amplifier 104. Hence for example the amplifier protection circuit has at least partially isolated or protected the first amplifier 104 from the backward wave.

The backwards signal may in some examples comprise a signal based on the signal from the first amplifier and reflected at the output of the amplifier protection circuit. For example, at least some of the signal from the first amplifier 104 may propagate through the amplifier protection circuit 100, and be reflected at the output 108 to form the backward wave. Additionally or alternatively, the source of the backward wave may be interference from an external source. In some examples, the isolation circuit comprises at least one sensed signal amplifier configured to amplify a signal based on the sensed signal and to provide the at least one cancellation signal. Hence the amplifier protection circuit 100 may be an active circuit such as an active isolator.

In some examples, the isolation circuit is configured to sense the backward signal using an extraction component, such as for example a directional coupler or power splitter, to extract a portion of the backward signal. The isolation circuit may in some examples be configured to provide the portion of the backward signal to at least one of an impedance transformer, a variable gain component and a variable phase component to provide the sensed signal. The sensed signal may then be amplified to provide the at least one cancellation signal in some examples.

Figure 2:
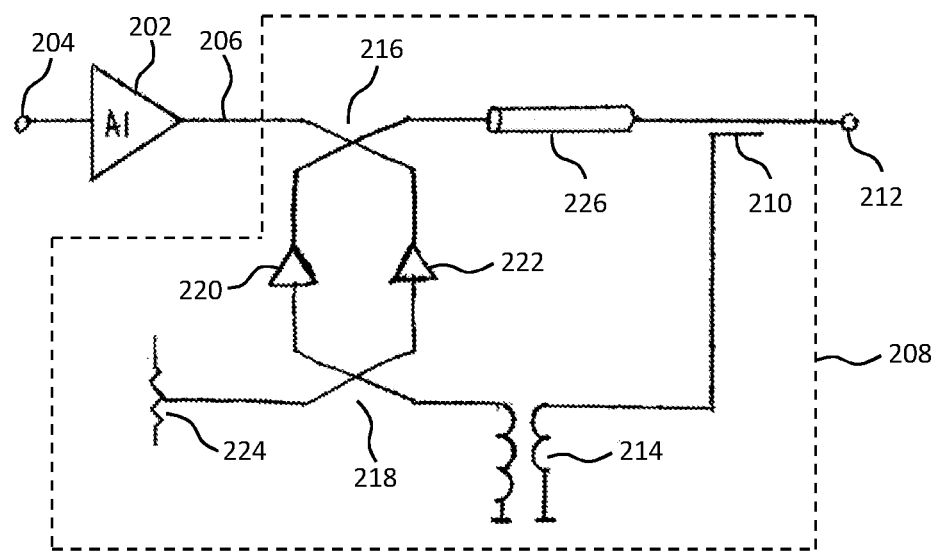
FIG. 2 is a schematic of an example of an amplifier protection circuit in more detail.

FIG. 2 is a schematic of an example of an amplifier protection circuit 200 in more detail. Also shown is a first amplifier 202 being protected, which can be any type of amplifier, but which may not be part of the amplifier protection circuit 200. The first amplifier 202 may receive a signal to be amplified at an amplifier input 204, and provide an amplified signal to the input 206 of the amplifier protection circuit 200.

In this example of an amplifier protection circuit 200 shown in FIG. 1, the amplifier protection circuit 200 includes an isolation circuit 208 that includes an extraction component 210, which may in some examples be a directional coupler or power splitter such as an asymmetric power splitter. The extraction component 210 is connected in such a way that a portion of a backwards wave propagating from the output 212 of the amplifier protection circuit 200 in the direction of the input 206 is extracted by the directional coupler 210 to form a sensed signal, whereas a "forward" wave traveling towards the output 212 does not contribute substantially to the sensed signal. The sensed signal is provided to an impedance transformer 214.

The isolation circuit 208 also includes a first directional coupler 216 (in this example a hybrid coupler), a second directional coupler 218 (in this example a hybrid coupler), a first sensed signal amplifier 220 and a second sensed signal amplifier 222. Thus in some examples the first and second sensed signal amplifiers 220 and 222 form a balanced amplifier.

The isolation circuit 208 is configured to provide the sensed signal (via the impedance transformer 214) to an input port of the second directional coupler 218. The transmitted port of the second directional coupler 218 is connected to an input of the first sensed signal amplifier 220, and the coupled port of the second directional coupler 218 is provided to an input of the second sensed signal amplifier 222. Thus for example the sensed signal amplifiers 220 and 222 may amplify signals based on the sensed signal from the extraction component 210, and may be configured to provide signals at the outputs of the first and second signal amplifiers based on the sensed signal. In this example shown in FIG. 2, the isolated port of the second directional coupler is terminated at terminating impedance 224.

The input 206 of the amplifier protection circuit 200 is connected to an input port of the first directional coupler 216. The output of the first sensed signal amplifier 220 is provided to a coupled port of the first directional coupler 216, and the output of the second sensed signal amplifier 222 is provided to a transmitted port of the first directional coupler 216. The isolated port of the first directional coupler 216 is connected to the output 212 of the amplifier protection circuit 200 via a transmission line 226.

An example of operation of the amplifier protection circuit 200 will now be described. A signal from the first amplifier 202 will pass the first directional coupler 216 largely unaffected if the reflection coefficients at the outputs of the sensed signal amplifiers are large and equal in phase and magnitude. For example, the main output signal from the first amplifier 202 enters the input port of the first directional coupler 216. The signal is split, and half (if the first directional coupler is a hybrid coupler) goes to the transmitted port at the output of second sensed signal amplifier 222. The other half couples backwards to the other line in the first directional coupler 216 and arrives with an extra 90-degree phase delay at the coupled port of the first directional coupler 216 at the output of the first sensed signal amplifier 220. The signal that reflects at the output of the first sensed signal amplifier 220 thus does so 90 degrees "behind" the signal at the output of the second sensed signal amplifier 222. The reflected signals that reenter the first directional coupler 216 are each split in two substantially equal parts. The signal reflected at the output of the first sensed signal amplifier 220 has a direct path to the isolated port (connected to the transmission line 226), and a coupled, 90-degrees delayed, path to the input port at the input 206 to the amplifier protection circuit 200. The signal reflected at the output of the second sensed signal amplifier 222 has a coupled, 90-degrees delayed, path to the isolated port of the first directional coupler 216, and a direct path to the input port. As a result, the reflected parts combine in phase at the isolated port and in antiphase at the input port. The wave from the first amplifier 202 that entered the first directional coupler 216 at the input port will thus exit at the isolated port, and be provided via transmission line 226 to the output 212 of the amplifier protection circuit 200.

The protection or isolation function of the amplifier protection circuit 200 operates in an example as follows. A small portion of the backward signal is extracted by extraction component 210 (e.g. a directional coupler or power divider) to form the sensed signal, transformed (e.g. to the gate-side network impedance) by impedance transformer 218, and provided to the input port of the second directional coupler 218. The signal is split into two parts (e.g. equal parts) with 90-degree phase difference which are provided to the inputs of sensed signal amplifiers 220 and 222 respectively, thus driving them with a 90-degree phase difference. If the inputs of A2 and A3 are reflective, any reflected signals will combine at the isolated port of second directional coupler 218 and be terminated at the termination impedance 224. An alternative way of ensuring a 90-degree phase shift in a narrow bandwidth is to couple the inputs of A2 and A3 at an electrical length separation of 90 degrees along a transmission line.

The sensed signal amplifiers 220 and 222 amplify signals based on the sensed signal a 90-degree phase difference caused by the second directional coupler 218. Their outputs are provided to the first directional coupler 216, and because of the phase difference their combined (in-phase) output will be provided to the input port at the input 206 of the amplifier protection circuit 200 and at the output of the first amplifier 202. This signal will combine with, and, due to its inverse phase, at least partially cancel the backwards wave itself. In more detail, the signal from the second sensed signal amplifier 222 entering the transmitted port of the first directional coupler 216 has a direct path to the input port, and a coupled, 90-degrees delayed, path to the isolated port (connected to the transmission line 226). The signal from the first sensed signal amplifier entering the coupled port of the first directional coupler 216 has a coupled, 90-degrees delayed, path to the input port, and a direct path to the isolated port. In total, this means that these signals combine in phase at the input port and in antiphase at the isolated port.

The direct backward signal and the inverse-phase amplified signal (based on the sensed signal) at least partially cancel at the input port of the first directional coupler 216. This means that in some examples the transit times in both paths (for the direct backward signal and the inverse-phase amplified signal respectively) should be substantially the same. The direct backward signal passes through the extraction component 210, transmission line 226 and the balanced amplifier comprised of first directional coupler 216 and sensed signal amplifiers 220 and 222, due to reflection at the outputs of the sensed signal amplifiers 220 and 222. In some examples, there may be a 270 degrees delay in the direct backward signal due to delays in the first directional coupler 216 plus forward and backward delays through output matching networks (not shown) of the sensed signal amplifiers 220 and 222. The path for the inverse-phase amplified signal consists of the extraction component 210, impedance transformer 214 (which may for example be a transmission line transformer), the second directional coupler 218, the input and output matching networks (not shown) of the sensed signal amplifiers 220 and 222 and finally the first directional coupler 216. If either or both of the sensed signal amplifiers 220 and 222 is an inverting amplifier (for example a common emitter type, CE), the phase, apart from the time delay, of the path from the extraction component 210 to the sensed signal amplifier 220 and/or 222 should be noninverting in some examples, otherwise a 180 degree phase inversion before or after the sensed signal amplifier(s) 220 and/or 222 may be provided.

The coupling factor of the extraction component 210 (e.g. what proportion of the backward signal is extracted to provide the sensed signal) may in some examples be determined by the gain in the sensed signal amplifiers 220 and 222 and any losses in the other components. Since the other components may have small losses, the coupling factor may be for example approximately the inverse of the total gain of the balanced amplifier including the directional couplers 216 and 218 and sensed signal amplifiers 220 and 222.

Another consideration in some examples is that extra supply voltage headroom may be needed at least at the sensed signal amplifiers 220 and 222 to accommodate the voltage swing of both the forward wave from Al and the backward wave. This is because the backward wave may not cancel at the drain terminals of transistors in the sensed signal amplifiers 220 and 222 but instead at the input port of the first directional coupler 216. In some examples, supply voltage headroom may be added directly to the amplifying transistors of the sensed signal amplifiers 220 and 222, the characteristic impedance of the first directional coupler 216 may be decreased (impedance transformation from the transistors may be changed accordingly). In some examples, the forward signal (from the first amplifier 202) and backward signal amplitudes, the headroom requirement, and hence the supply voltage or impedance level are equal for the first and second sensed signal amplifiers 220 and 222 in an ideal (balanced, tuned, and lossless) case.

Figure 3:
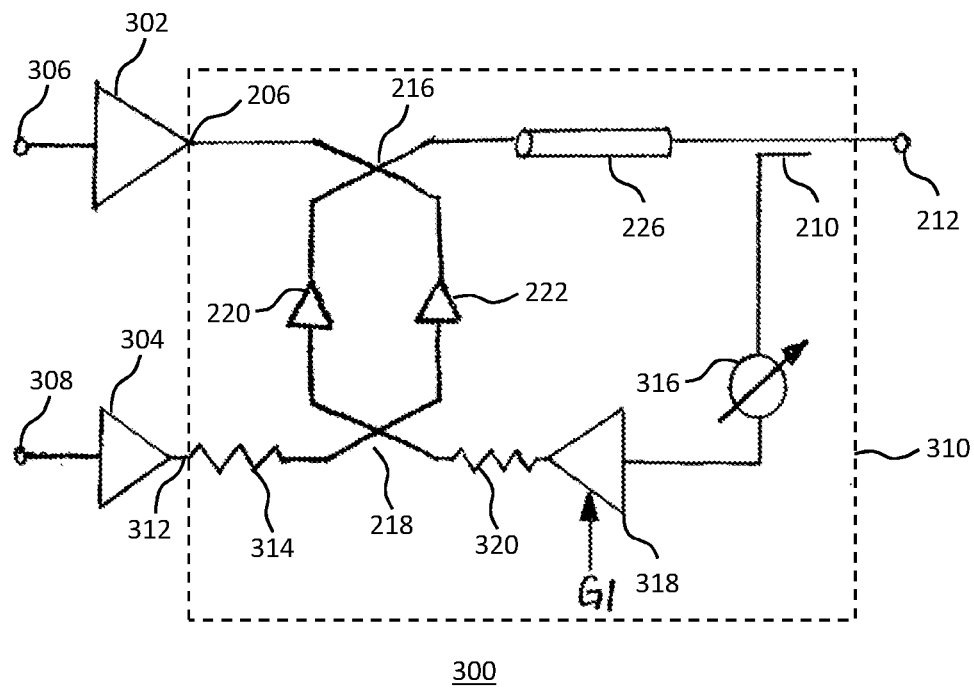
FIG. 3 is a schematic of another example of an amplifier protection circuit.

FIG. 3 is a schematic of another example of an amplifier protection circuit 300 in more detail. Also shown is a first amplifier 302 being protected and a second amplifier 304, and the amplifiers 302 and 304 may not be part of the amplifier protection circuit 300. The first and second amplifiers 302 and 304 may comprise a balanced amplifier and receive signals 306 and 308 to be amplified respectively. The first amplifier 302 may receive a signal to be amplified at an amplifier input 306, and provide an amplified signal to the input 206 of the amplifier protection circuit 300.

The amplifier protection circuit 300 and isolation circuit 310 therein include several components that are similar or identical to those in the amplifier protection circuit 200 of FIG. 2 and are connected in the same or similar manner, and are thus given the same reference numerals. Therefore, the amplifier protection circuit 300 includes first and second directional couplers 216 and 218, first and second sensed signal amplifiers 220 and 222, transmission line 226, and output 212 of the amplifier protection circuit 300. The input 206 of the amplifier protection circuit 300 is connected to the input port of the first directional coupler 216 as in the amplifier protection circuit 200 of FIG. 2 above. However, as shown in FIG. 3, the output of the second amplifier 304 is connected to a second input 312 of the amplifier protection circuit 300, which is in turn connected to the isolated port of second directional coupler 218 via an impedance 314 (which in some examples may not be a separate component and represents the output impedance of the second amplifier 304). In this example, amplifier 304 may be used for driving the balanced amplifier comprising first and second sensed signal amplifiers 220 and 222 in the forward direction (e.g. so that a resulting signal is provided to the circuit output 212). In alternative examples, this balanced amplifier could instead be driven directly from an input signal without the second amplifier 304, e.g. the input signal could be provided directly to the isolated port of the second directional coupler 218.

In addition, instead of the impedance transformer 214 of FIG. 2, the isolation circuit 310 instead includes a phase adjuster 316 and variable gain amplifier 318 connected in series between the extraction component 210 and the input port of the second directional coupler 218. An impedance 320 is also shown connected between the variable gain amplifier 318 and the input port of the second directional coupler 218, though in some examples this may not be a separate component and instead represents the output impedance of the variable gain amplifier 318. It is noted that the isolation circuit 208 of FIG. 2 and the isolation circuit 310 of FIG. 3, and any other suitable example of an isolation circuit, may use the arrangement of FIG. 2 or 3, or both, between the extraction component 210 and the input port of the second directional coupler 218. That is, between these two nodes, there may be a variable gain amplifier and phase adjuster, or an impedance transformer, or all three of these components.

In an example operation, the amplifier protection circuit may operate as follows. The sensed signal amplifiers 220 and 222 may operate as a balanced amplifier both as an amplifying stage in the forward direction and as an isolator in the backwards direction, as shown in the following figure. The amplifier to be protected (the first amplifier 302) can be any type of amplifier, though in some examples may be coordinated in size, impedance level and drive signal design with the balanced amplifier comprising sensed signal amplifiers 220 and 222.

A portion of the backward signal may be extracted by extraction component 210 (which may be for example a directional coupler or power splitter such as an asymmetric power splitter) to provide the sensed signal, and the sensed signal is provided to the input port of the second directional coupler 218 via the phase adjuster 316 and variable gain amplifier 318. The amount of protection or isolation for the first amplifier 302 may be adjusted by adjustments to the phase and amplitude of the sensed signal by phase adjuster 316 and variable gain amplifier 318 (e.g. controlled by gain setting G1 shown in FIG. 3). The signal output from the variable gain amplifier 318 (e.g. via impedance 320) is amplified by the balanced amplifier comprising sensed signal amplifiers 220 and 222, similar to the operation of the amplifier protection circuit 200 described above, but in the amplifier protection circuit 300 of FIG. 3 the isolated port of second directional coupler 218 is terminated by the output impedance of the second amplifier 312 (represented in some examples by impedance 314). This impedance 314 may in some examples be matched to the characteristic impedance of the second directional coupler 218 and possibly also surrounding transmission lines, may and terminate the signal so that little or no reflected signal interferes with the operation of the balanced amplifier comprising the sensed signal amplifiers 220 and 222 and directional couplers 216 and 218. The output impedance of the variable gain amplifier 318, represented in some examples by impedance 320, may in some examples be matched to the characteristic impedance in a similar manner.

The second amplifier 304 may also be used for forward amplification by injecting a drive signal in the forward direction. This drive signal is terminated at the input port of the second directional coupler 218 by the output impedance of the variable gain amplifier 318 (e.g. represented by impedance 320). However, at least some of the drive signal reaches the sensed signal amplifiers 220 and 222.

The coupling factor of the extraction component 210 may in some examples be determined based on the gain in the amplifiers 220, 222 and 318, and in some examples also any losses in other components. The variable gain amplifier 318 has a variable gain G1 that may in some examples be used to compensate for gain variations (e.g. production spread, temperature drift) in the other amplifiers and components.

The supply voltage headroom discussed in relation to the amplifier protection circuit 200 may also be used in examples of the amplifier protection circuit 300 of FIG. 3. In this case, the forward signal voltage from the second amplifier 304 may also be considered. As in the example above, the supply voltage may be increased and/or the impedance level decreased.

Figure 4:
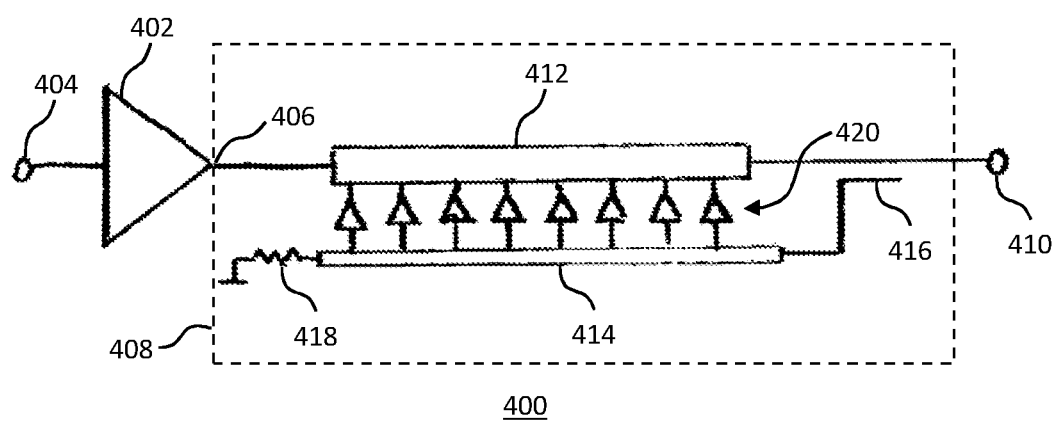
FIG. 4 is a schematic of another example of an amplifier protection circuit.

FIG. 4 is a schematic of another example of an amplifier protection circuit 400. Also shown is a first amplifier 402 being protected, which can be any type of amplifier, but which may not be part of the amplifier protection circuit 400. The first amplifier 402 may receive a signal to be amplified at an amplifier input 404, and provide an amplified signal to the input 406 of the amplifier protection circuit 400.

The amplifier protection circuit 400 includes an isolation circuit 408 connected between the input 406 of the amplifier protection circuit 400 and an output 410 of the amplifier protection circuit 400. The isolation circuit 408 is configured to sense a backward signal propagating from the output 410 of the amplifier protection circuit 400 towards the input 406 to provide a sensed signal, and to provide at least one cancellation signal based on the sensed signal to at least partially cancel the backward signal.

In this example of an amplifier protection circuit 400 shown in FIG. 4, the isolation circuit 408 includes a first transmission line 412 and a second transmission line 414. A first end of the first transmission line 412 is connected to the input 406 of the amplifier protection circuit 400, and a second end of the first transmission line 412 is connected to the output 410 of the amplifier protection circuit 400. The isolation circuit is configured to provide the sensed signal to a first end of the second transmission line. In the example shown in FIG. 4, the sensed signal is provided by extraction component 416, which may be for example a directional coupler or (e.g. asymmetric) power splitter, and which extracts a portion of the backward wave (which may be a reflected wave or generated by interference). In the example shown in FIG. 4, a second end of the second transmission line 414 is terminated at terminating impedance 418.

The isolation circuit 408 also comprises a plurality of amplifiers 420. In the example shown, there are eight amplifiers 420, though in other examples there may be two or more amplifiers. Each of the amplifiers 420 is connected between the second transmission line 414 and first transmission line 412. That is, for example, inputs of the plurality of amplifiers 420 are distributed along the second transmission line 414, and outputs of the plurality of amplifiers 420 are distributed along the first transmission line 412. Each amplifier may be configured to provide a respective cancellation signal to the first transmission line to partially cancel the backward signal. In some examples, impedance transformation (and/or variable gain and phase) may be provided between the extraction component 416 and the second transmission line 414. Additionally or alternatively, in some examples, length of some transmission lines within the amplifier protection circuit 408 may be selected for appropriate signal synchronization, e.g. between the backward signal and the at least one cancellation signal.

The plurality of amplifiers 420 are connected such that their outputs (e.g. transistor drains) are connected to the first transmission line 412 and inputs (e.g. gates) are connected to the second transmission line 414. In some examples, parasitic capacitances at the inputs and outputs of the amplifiers 420 may be absorbed into the capacitance of the transmission lines, so that no additional matching networks are necessary.

The protection or isolation function of the isolation circuit 408 operates in an example as follows. A portion of the backward signal is extracted by extraction component 416 to provide the sensed signal. This signal provided to the second transmission line 414, and a cancellation signal (e.g. small RF current) will be generated in each amplifier 420 and provided to the first transmission line 412. This will reduce the backward signal as it propagates along the first transmission line 412 towards the input 406 of the amplifier protection circuit 408. The terminating impedance 418 may ensures that the gate signal is not reflected back into the second transmission line 414. The coupling factor of the extraction component 416 may in some examples be determined by the gain in the amplifiers 420 and/or any losses in the other components, and the coupling factor and/or gains may be selected in some examples so that the backward signal is substantially cancelled by the time (or before) it reaches the first end of the first transmission line 412.

The number of amplifiers (or transistors) in the plurality of amplifiers 420 may in some examples depend on one or more of the following factors. Firstly, the absorption of parasitic capacitance into the transmission lines 412 and 414 may improves, in amount and frequency range, if more (but in some examples smaller) amplifiers are included in the plurality of amplifiers 420. Secondly, the amplitude and phase ripple over the frequency range may be lower with a larger number of amplifiers. A smaller number of amplifiers (e.g. two) may result in good protection or isolation only in a narrower frequency range. The length of the first transmission line 412 may in some examples depend mainly on the lower corner frequency of isolation. The electrical length at the lower corner frequency of isolation is may be for example approximately half the wavelength of the backward signal.

In some examples, sufficient supply voltage headroom to allow for the total swing of both the forward signal (from the first amplifier 402) and the backward signal may be provided for the plurality of amplifiers 420. For maximum efficiency, the supply voltage to each amplifier 420 may be as small as possible in some examples. The forward signal may have substantially constant amplitude on a constant impedance line, but the backward wave starts out high and is successively reduced along the line. Therefore, in some examples, a respective supply voltage for a first amplifier of the plurality of amplifiers 420 may be higher than a respective supply voltage for a second amplifier of the plurality of amplifiers 420, wherein the output of the first amplifier of the plurality of amplifiers 420 is connected to a first point on the first transmission line 412 that is closer to the second end of the first transmission line 412 than a second point on the first transmission line 412, and wherein the output of the second amplifier of the plurality of amplifiers 420 is connected to the second point. In other words, the supply voltages to the amplifiers 420 may in some examples be higher for amplifiers whose outputs are closer to the output 410 of the amplifier protection circuit 400. Additionally or alternatively, in some examples, the impedance of the first transmission line 412 may be tapered so that it is lower at the second end than at the first end. In other words, in some examples, the impedance of the first transmission line 412 may decrease from the first end to the second end of the first transmission line 412. In an example implementation, the first transmission line 412 may be at the second end for a constant dielectric constant/constant thickness material.

Figure 5:
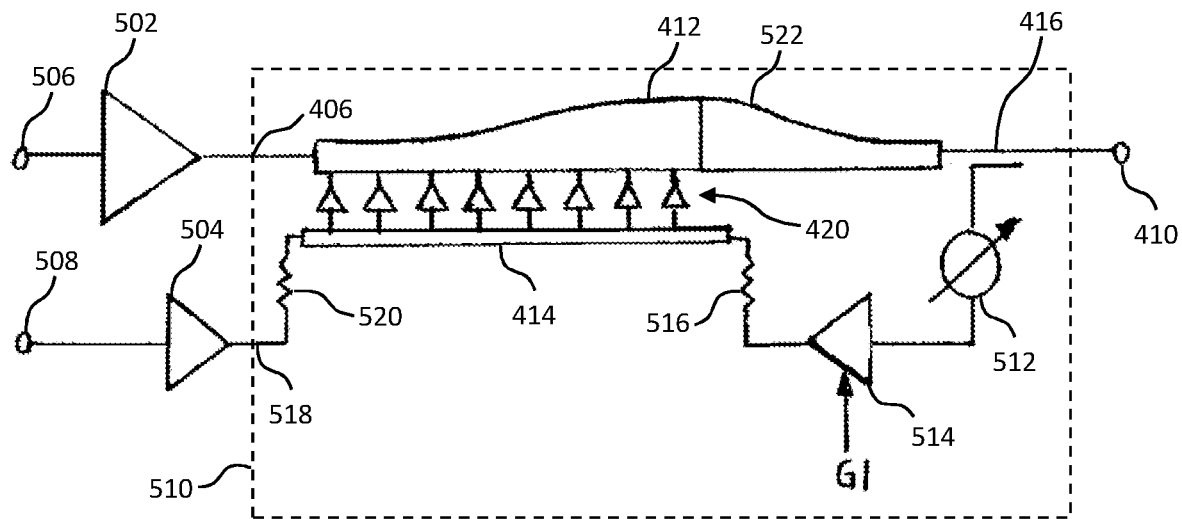
FIG. 5 is a schematic of another example of an amplifier protection circuit.

FIG. 5 is a schematic of another example of an amplifier protection circuit 500. Also shown is a first amplifier 502 and a second amplifier 504 being protected, which may not be part of the amplifier protection circuit 500. The first and second amplifiers 502 and 504 may comprise a balanced amplifier and receive signals 506 and 508 to be amplified respectively.

The first amplifier 502 may receive a signal to be amplified at an amplifier input 506, and provide an amplified signal to the input 406 of the amplifier protection circuit 500.

The amplifier protection circuit 500 and isolation circuit 510 therein include several components that are similar or identical to those in the amplifier protection circuit 200 of FIG. 4 and are connected in the same or similar manner, and are thus given the same reference numerals. Therefore, the amplifier protection circuit 500 includes an input 406 for receiving a signal output from the first amplifier 502. The amplifier protection circuit 500 includes an isolation circuit 510 that comprises a first transmission line 412 between the input 406 and output 410 of the amplifier protection circuit. A plurality of amplifiers 420 are connected between a second transmission line 414 and the first transmission line 412. An extraction component 416 extracts a portion of the backward signal and provides the resulting sensed signal to the first end of the second transmission line 414, in this example via a phase adjuster 512, variable gain amplifier 514 and impedance 516 (which in some examples may not be a separate component and may represent the output impedance of the variable gain amplifier 514). The output of the second amplifier 504 is provided to a second input 518 of the amplifier protection circuit 500, which is connected to the second end of the second transmission line 414 via impedance 520 (which in some examples may not be a separate component and may represent the output impedance of the second amplifier 504). The isolation circuit 510 is configured to sense a backward signal propagating from the output 410 of the amplifier protection circuit 500 towards the input 406 to provide a sensed signal, and to provide at least one cancellation signal based on the sensed signal to at least partially cancel the backward signal.

This example may use the plurality of amplifiers 420 for both the protection or isolation function and for amplification in the forward direction. The first amplifier 502 to be protected can be any type of amplifier. However, by choosing the output power and bandwidth and using properly designed drive signals, it may in some examples form a DEPA together with the second amplifier 504. The example shown in FIG. 5 also includes a transmission line impedance transformer 522 connected between the first transmission line 412 and the circuit output 410. This impedance transformer 522 may in some examples be adjusted in length to provide a delay to the backward signal so that it synchronizes with the signals provided by the amplifiers 420 that are based on the sensed signal (after passing through phase adjuster 512 and variable gain amplifier 514). If the time delay of the impedance transformer 522 is too long, a compensating delay may in some examples be provided, for example by lengthening the second transmission line 414 towards the variable gain amplifier 514, and/or by adjusting the phase adjustment provided by the phase adjuster 512.

As for the amplifier protection circuit 400 described above, the power supply for the plurality of amplifiers 420 in the amplifier protection circuit 400 may decrease for amplifiers further from the second end of the first transmission line 412. Any supply voltage headroom should in some examples be sufficient to allow for the forward wave provided by the second amplifier 504. Additionally or alternatively, the impedance of the first transmission line 412 may decrease from the first end to the second end. This is illustrated in FIG. 5 by the width of the first transmission line 412 increasing towards the second end.

Figure 6:
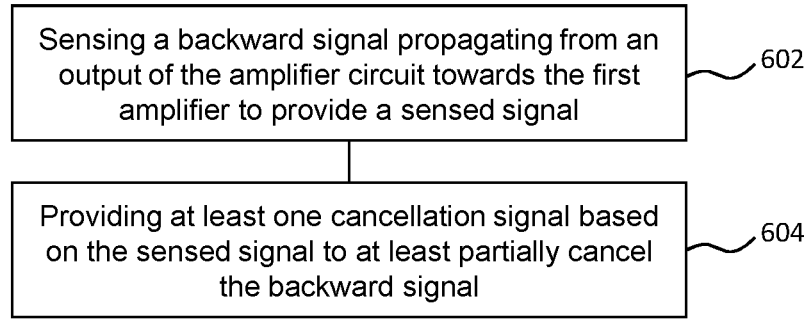
FIG. 6 is a flow chart of an example of a method of protecting an amplifier circuit.

FIG. 6 is a flow chart of an example of a method 600 of protecting an amplifier circuit. The amplifier circuit comprises a first amplifier. In some examples, the method may be performed using one of the example the amplifier protection circuits described above. The method 600 comprises, in step 602, sensing a backward signal propagating from an output of the amplifier circuit towards the first amplifier to provide a sensed signal, and in step 604, providing at least one cancellation signal based on the sensed signal to at least partially cancel the backward signal (e.g. at least partially destructively interfere with the backward signal).

In some examples, the method 600 further comprises amplifying a signal based on the sensed signal to provide the at least one cancellation signal. This may be done for example by the first and second sensed signal amplifiers 220 and 222 described above, and/or the plurality of amplifiers 420 described above.

The method 600 may also comprise providing the portion of the backward signal to at least one of an impedance transformer, a variable gain component and a variable phase component to provide the sensed signal. Examples of these components include the impedance transformer 214, the variable gain amplifiers 318 and 514, and the phase adjusters 316 and 512.

In some examples, the method 600 may comprise amplifying the sensed signal using a bidirectional amplifier configured to provide the amplified sensed signal to the output of the first amplifier, and configured to provide a signal output from the first amplifier to the output of the amplifier circuit. This bidirectional amplifier may in some examples comprise at least the first directional coupler 216 and the sensed signal amplifiers 220 and 222 described above.

The power consumption and loss of examples of the amplifier protection circuits described herein may depend on many factors and may be modified depending on different circumstances. Generally, example amplifier protection circuits may consume power in approximate proportion to the backward signal amplitude. However, other overheads and power consumption may be reduced or avoided.

The examples shown in FIGS. 2 and 4 may in some examples have the benefit of being able to de-power the sensed signal amplifiers (220, 222 and 420), for example by lowering the gate bias voltage, when there is no backward signal to protect or isolate from. However, these examples may instead suffer from more transmission loss than the examples shown in FIGS. 3 and 5 since the forward signal (signal from the first amplifier) may in some examples pass along a longer length of transmission line, directional coupler, and matching network to reach the output of the amplifier protection circuit.

Some examples of the circuits shown in FIGS. 3 and 5 may on the other hand have lower transmission loss and fewer transistors but instead may be more difficult to de-power when the protection/isolation function is not needed. It should be noted that the lower transmission loss (e.g. shorter length) and fewer transistors may be as a result of not needing a separate stage for amplifier protection/isolation if this is instead provided by a stage that also is a part of the amplifier in the forward direction, as in examples of FIGS. 3 and 5. Any extra supply voltage headroom to accommodate the backward wave may decrease the efficiency of the forward amplification, so it may be beneficial in some examples to reduce this when there is no backward signal to protect or isolate from. However, lowering the supply voltage may in some examples be slower and more complicated than lowering gate bias voltage, and changing the impedance of a transmission line even more so.

Any nonlinear mixing between the forward and backward signals may give rise to intermodulation products within the amplifier protection circuits. This may happen for example both in the isolation circuits, where the signals may be large, and in the protected first amplifier due to imperfect, finite backward protection/isolation. Some examples may include predistortion methods (algorithms or circuits) to address these problems. For example, leakage between antennas can be handled with array predistortion techniques. External signals may in some examples be detected and used as a separate source to form mixing products together with the forward signal in a predistorter.

Figure 7:
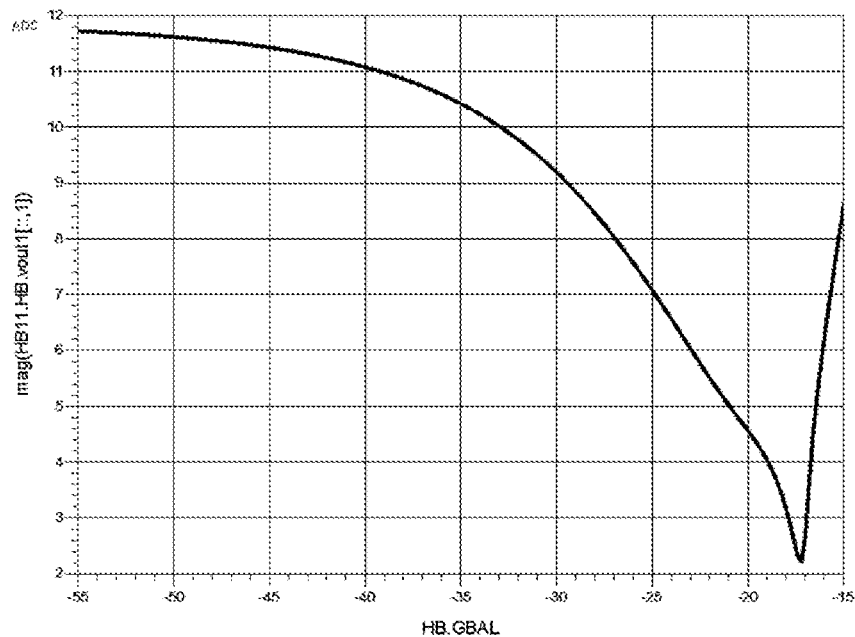
FIG. 7 shows a graph of simulation results of an example of an amplifier protection circuit.

The performance of examples of amplifier protection circuits as disclosed herein have been simulated. In one example, an implementation of the amplifier protection circuit 200 as shown in FIG. 2 has been simulated, except that a transmission line for phase compensation is connected between the impedance transformer 214 and the input port of the second directional coupler 218. The directional couplers 216 and 218 are implemented as 90-degree 3-dB hybrids (branch-line couplers). The voltage at the output of the first amplifier 202 due to the backward signal is shown in FIG. 7, which shows a graph of simulation results of an example of an amplifier protection circuit. In the simulation, the coupling factor of the extraction component (implemented as a directional coupler) is swept between −55 and −15 dB, shown on the x-axis, with voltage on the y-axis. At −55 dB there is very little signal being extracted to form the sensed signal, and the protection or isolation function is essentially turned off. The reverse wave voltage is here almost 12 volts. At around −17 dB, there is a minimum in reverse wave voltage of just above 2 volts. This can therefore be the coupling factor chosen to be used in this implementation of the amplifier protection circuit. In practice, in some examples, the optimal coupling factor and phase adjustment may vary with bias and signal levels. To counteract this, phase and gain adjustment may be included (e.g. as shown in FIGS. 3 and 5).

Figure 8:
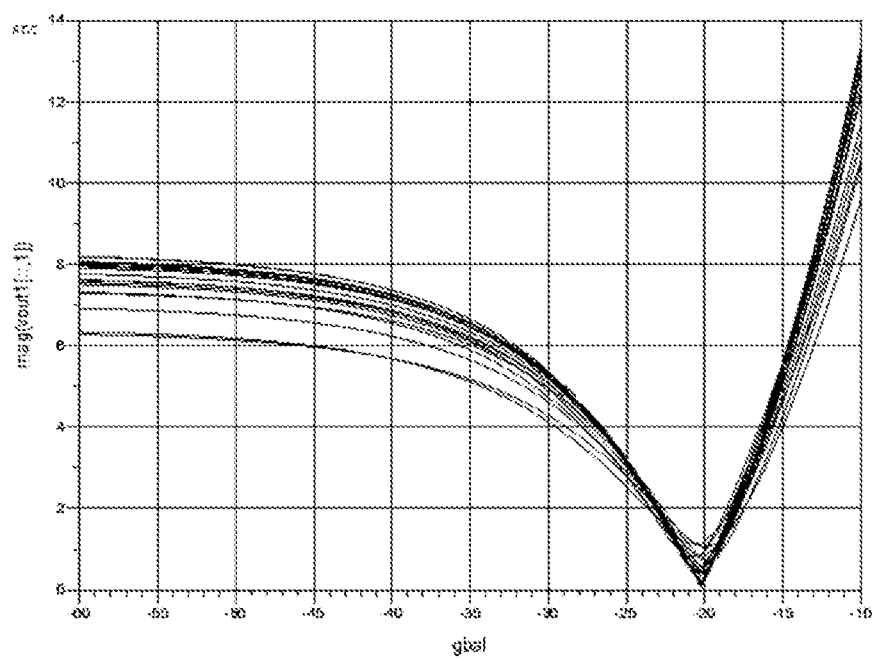
FIG. 8 shows a graph of simulation results of another example of an amplifier protection circuit.
Figure 9:
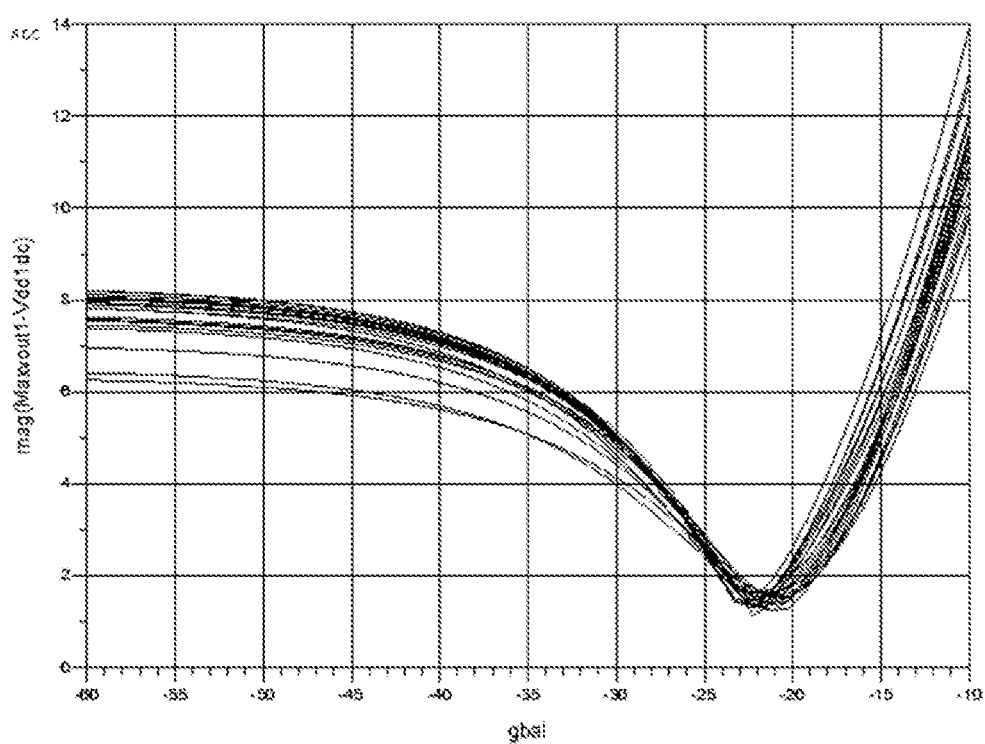
FIG. 9 shows a graph of simulation results of a maximum instantaneous voltage of the another example of an amplifier protection circuit.

In another example, implementations of the amplifier protection circuit 400 as shown in FIG. 4 have been simulated, with the addition of an impedance transformer between the extraction component 416 (implemented as a directional coupler) and the first end of the second transmission line 414 (some example implementations the impedance transformer may be implemented with transmission lines or directly in the extraction component). The voltage at the output of the first amplifier 402 due to the backward signal is shown in FIG. 8, which shows a graph of various simulation results of another example of an amplifier protection circuit. In the simulations, the coupling factor of the extraction component (implemented as a directional coupler) is swept between −60 and −10 dB, shown on the x-axis, with voltage on the y-axis. The different simulations correspond to different frequencies of the backward signal, distributed evenly from 1 GHz to 4 GHz. It can be seen that at a coupling factor of −60 dB (i.e. the protection or isolation function effectively turned off) the backward signal voltage is above 6 volts over much of the frequency range at the output of the first amplifier 402. At around −20 or −21 dB coupling factor there is a minimum in voltage of the backward wave at the output of the first amplifier 402. FIG. 9 shows a graph of the same simulations and illustrates a maximum instantaneous voltage for each simulation as the coupling factor is swept over the same range as for FIG. 8.

It should be noted that the above-mentioned examples illustrate rather than limit the invention, and that those skilled in the art will be able to design many alternative examples without departing from the scope of the appended statements. The word "comprising" does not exclude the presence of elements or steps other than those listed in a claim, "a" or "an" does not exclude a plurality, and a single processor or other unit may fulfil the functions of several units recited in the statements below. Where the terms, "first", "second" etc. are used they are to be understood merely as labels for the convenient identification of a particular feature. In particular, they are not to be interpreted as describing the first or the second feature of a plurality of such features (i.e. the first or second of such features to occur in time or space) unless explicitly stated otherwise. Steps in the methods disclosed herein may be carried out in any order unless expressly otherwise stated. Any reference signs in the statements shall not be construed so as to limit their scope.

REFERENCES

The following references are incorporated herein by reference:

1. Shepphard et al. "An Efficient Broadband Reconfigurable Power Amplifier Using Active Load Modulation," IEEE Microwave and Wireless Components Letters, vol. 26, no. 6, June 2016
2. Pyndiah et al., NOVEL MULTIOCTAVE MMIC ACTIVE ISOLATOR (1-20 GHz), ELECTRONICS LETTERS 12th October 1989 Vol. 25 No. 21, pp 1420-1422
3. Leisten et al., DISTRIBUTED AMPLIFIERS AS DUPLEXER/LOW CROSSTALK BIDIRECTIONAL ELEMENTS IN S-BAND, ELECTRONICS LETTERS 3rd March 1988 Vol. 24 No. 5, pp. 264-265
4. CHANG et al.: DESIGN AND ANALYSIS OF 24-GHz ACTIVE ISOLATOR AND QUASI-CIRCULATOR, IEEE TRANSACTIONS ON MICROWAVE THEORY AND TECHNIQUES, VOL. 63, NO. 8, AUGUST 2015, pp. 2638-2649

The invention claimed is:

1. An amplifier protection circuit comprising:
an input for receiving a signal from a first amplifier; and
an isolation circuit between the input and an output of the amplifier protection circuit, wherein the isolation circuit is configured to sense a backward signal propagating from the output of the amplifier protection circuit towards the input to provide a sensed signal, and to provide at least one cancellation signal based on the sensed signal to at least partially cancel the backward signal; and
wherein the isolation circuit comprises a first directional coupler, first sensed signal amplifier, and second sensed signal amplifier, wherein the input of the amplifier protection circuit is connected to an input port of the first directional coupler, an output of the first sensed signal amplifier is provided to a coupled port of the first directional coupler, an output of the second sensed signal amplifier is provided to a transmitted port of the first directional coupler, and an isolated port of the first directional coupler is connected to the output of the amplifier protection circuit, and wherein the first and second sensed signal amplifiers are configured to provide signals at the outputs of the first and second signal amplifiers based on the sensed signal.

2. The amplifier protection circuit of claim 1, wherein the isolation circuit is configured to at least partially isolate the input of the amplifier protection circuit from the backward signal.

3. The amplifier protection circuit of claim 1, wherein the at least one cancellation signal at least partially destructively interferes with the backward signal.

4. The amplifier protection circuit of claim 1, wherein the isolation circuit is configured to sense the backward signal using an extraction component to extract a portion of the backward signal and wherein the extraction component comprises a directional coupler or power splitter.

5. The amplifier protection circuit of claim 4, wherein the isolation circuit is configured to provide the portion of the backward signal to at least one of an impedance transformer, a variable gain component, and a variable phase component, to provide the sensed signal.

6. The amplifier protection circuit of claim 1, wherein the first directional coupler, the first sensed signal amplifier and the second sensed signal amplifier comprise a bidirectional amplifier configured to amplify the sensed signal and provide it to the input port of the first directional coupler, and to amplify a signal from the input of the amplifier protection circuit and provide it to the isolated port of the first directional coupler.

7. The amplifier protection circuit of claim 1, wherein the isolation circuit comprises a second directional coupler, and the isolation circuit is configured to provide the sensed signal to an input port of the second directional coupler, wherein the transmitted port of the second directional coupler is connected to an input of the first sensed signal amplifier, and the coupled port of the second directional coupler is provided to an input of the second sensed signal amplifier.

8. The amplifier protection circuit of claim 7, wherein the isolated port of the second directional coupler is terminated and wherein the isolated port of the second directional coupler is connected to a second input of the amplifier protection circuit for receiving a signal from a second amplifier.

9. The amplifier protection circuit of claim 8, wherein the first amplifier and the second amplifier comprise a balanced amplifier.

10. The amplifier protection circuit of claim 1, wherein the first directional coupler comprises a first hybrid coupler, and/or the second directional coupler comprises a second hybrid coupler.

11. The amplifier protection circuit of claim 1, wherein at least one of the first sensed signal amplifier and the second sensed signal amplifier comprises an inverting amplifier.

12. The amplifier protection circuit of claim 1, wherein the isolation circuit is configured to provide the at least one cancellation signal at the input port of the first directional coupler.

13. An amplifier protection circuit comprising:
an input for receiving a signal from a first amplifier; and
an isolation circuit between the input and an output of the amplifier protection circuit, wherein the isolation circuit is configured to sense a backward signal propagating from the output of the amplifier protection circuit towards the input to provide a sensed signal, and to provide at least one cancellation signal based on the sensed signal to at least partially cancel the backward signal;
wherein the isolation circuit comprises a first transmission line and a second transmission line, a first end of the first transmission line is connected to the input of the amplifier protection circuit, a second end of the first transmission line is connected to the output of the amplifier protection circuit, and the isolation circuit is configured to provide the sensed signal to a first end of the second transmission line, and
wherein the isolation circuit comprises a plurality of amplifiers, wherein inputs of the plurality of amplifiers are distributed along the second transmission line, and outputs of the plurality of amplifiers are distributed along the first transmission line, and wherein each amplifier provides a respective cancellation signal to the first transmission line to partially cancel the backward signal.

14. The amplifier protection circuit of claim 13, wherein a second end of the second transmission line is terminated.

15. The amplifier protection circuit of claim 14, wherein a second end of the second transmission line is connected to a second input of the amplifier protection circuit for receiving a signal from a second amplifier.

16. The amplifier protection circuit of claim 15, wherein the first amplifier and the second amplifier comprise a balanced amplifier.

17. The amplifier protection circuit of claim 13, wherein a respective supply voltage for a first amplifier of the plurality of amplifiers is higher than a respective supply voltage for a second amplifier of the plurality of amplifiers, wherein the output of the first amplifier of the plurality of amplifiers is connected to a first point on the first transmission line that is closer to the second end of the transmission line than a second point on the first transmission line, and wherein the output of the second amplifier of the plurality of amplifiers is connected to the second point.

* * * * *